(12) United States Patent
Shimizu et al.

(10) Patent No.: US 9,318,955 B2
(45) Date of Patent: Apr. 19, 2016

(54) POWER SUPPLY APPARATUS WITH FEEDBACK RATIO CALCULATION UNIT

(71) Applicant: ADVANTEST CORPORATION, Tokyo (JP)

(72) Inventors: Takahiko Shimizu, Tokyo (JP); Katsuhiko Degawa, Tokyo (JP)

(73) Assignee: ADVANTEST CORPORATION (JP)

( * ) Notice: Subject to any disclaimer, the term of this patent is extended or adjusted under 35 U.S.C. 154(b) by 274 days.

(21) Appl. No.: 13/928,323

(22) Filed: Jun. 26, 2013

(65) Prior Publication Data

US 2014/0002036 A1    Jan. 2, 2014

(30) Foreign Application Priority Data

Jun. 28, 2012  (JP) ................................ 2012-145858

(51) Int. Cl.
| | |
|---|---|
| H02M 3/157 | (2006.01) |
| H02M 3/04 | (2006.01) |
| H02M 1/00 | (2007.01) |
| G01R 1/00 | (2006.01) |

(52) U.S. Cl.
CPC ................ *H02M 3/157* (2013.01); *H02M 3/04* (2013.01); *G01R 1/00* (2013.01); *H02M 1/00* (2013.01); *H02M 2001/0012* (2013.01); *H02M 2001/0025* (2013.01)

(58) Field of Classification Search
CPC ............. H02M 2001/0012; H02M 2001/0025; H02M 3/04; H02M 3/157
See application file for complete search history.

(56) References Cited

U.S. PATENT DOCUMENTS

| | | | | |
|---|---|---|---|---|
| 8,006,109 | B2 * | 8/2011 | Motomiya et al. ............. | 713/320 |
| 2004/0189272 | A1 * | 9/2004 | Matsuura et al. ............. | 323/283 |
| 2006/0044852 | A1 * | 3/2006 | Suzuki ............................ | 363/59 |
| 2007/0268006 | A1 * | 11/2007 | Devey ........................... | 323/222 |
| 2010/0320974 | A1 * | 12/2010 | Manlove et al. .............. | 323/222 |
| 2011/0096571 | A1 * | 4/2011 | Usuda et al. .................. | 363/21.1 |
| 2011/0309960 | A1 * | 12/2011 | Shimizu et al. ............... | 341/110 |
| 2011/0316508 | A1 * | 12/2011 | Cheng et al. ................... | 323/282 |
| 2014/0084892 | A1 * | 3/2014 | Trautmann et al. ........... | 323/285 |

FOREIGN PATENT DOCUMENTS

| | | |
|---|---|---|
| JP | H06-249889 | 9/1994 |
| JP | 2012-2666 | 5/2012 |

* cited by examiner

*Primary Examiner* — Fred E Finch, III
(74) *Attorney, Agent, or Firm* — Cantor Colburn LLP (57) ABSTRACT

A power supply apparatus supplies a power supply signal to a device's power supply terminal via a power supply line. An A/D converter receives, via a feedback line, an analog measurement value corresponding to the power supply signal supplied to the device's power supply line, and converts the analog measurement value into a digital measurement value. A digital calculation unit generates a control value by digital calculation such that the digital measurement value from the A/D converter matches a predetermined reference value. A D/A converter digital/analog converts the control value so as to supply the analog power supply signal to the device's power supply terminal via the power supply line. A feedback ratio calculation unit calculates the ratio between the control value and the digital measurement value. The digital calculation unit is configured to change its calculation content based on the ratio calculated by the feedback ratio calculation unit.

12 Claims, 8 Drawing Sheets

POWER SUPPLY APPARATUS WITH FEEDBACK RATIO CALCULATION UNIT

CROSS-REFERENCE TO RELATED APPLICATION

This application claims priority from Japanese Patent Application No. 2012-145858, filed on Jun. 28, 2012, the disclosure of which is hereby incorporated by reference in its entirety.

BACKGROUND OF THE INVENTION

1. Field of the Invention

The present invention relates to a power supply apparatus configured to supply a power supply voltage or otherwise a power supply current to a device.

2. Description of the Related Art

Figure 1:
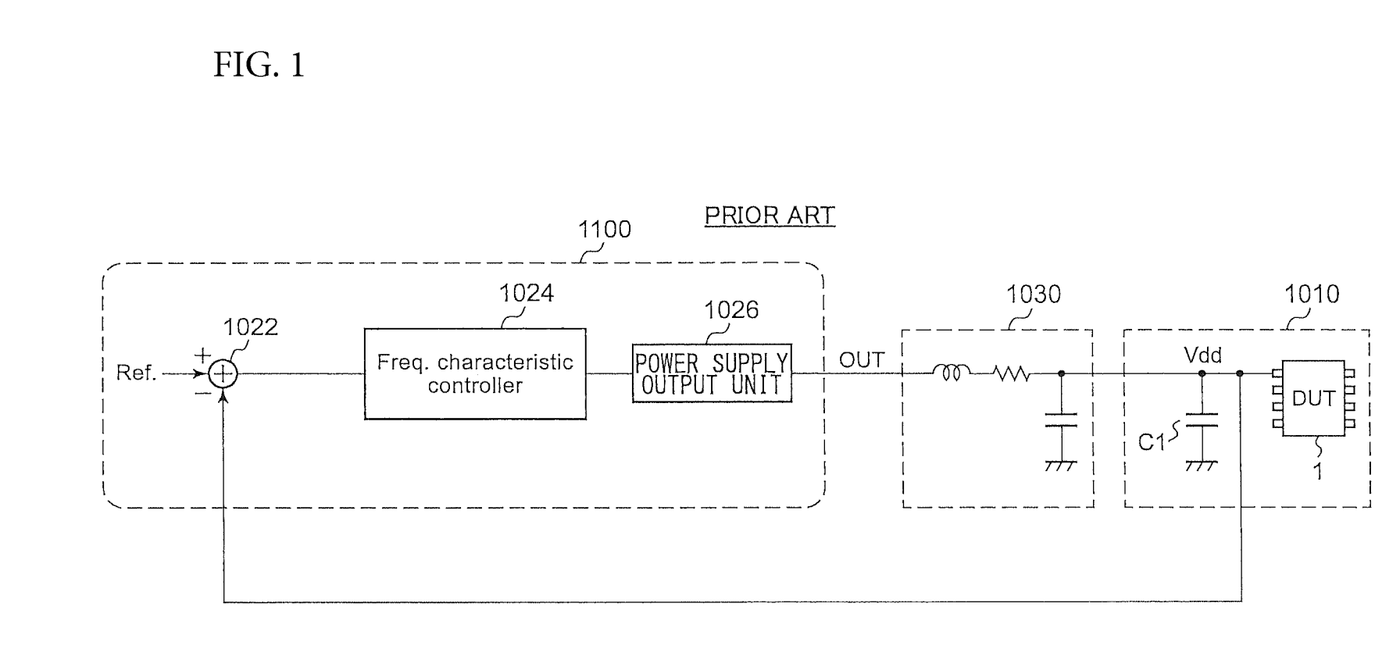
FIG. 1 is a block diagram showing a schematic configuration of a conventional power supply apparatus.

A test apparatus includes a power supply apparatus configured to supply a power supply voltage or power supply current (which will be referred to as the "power supply voltage $V_{DD}$" hereafter) to a device under test (DUT). FIG. 1 is a block diagram which shows a schematic configuration of a conventional power supply apparatus. A power supply apparatus 1100 includes a power supply output unit 1026 and a frequency controller (which will be referred to as the "controller" hereafter) 1024 configured to control the power supply output unit 1026. For example, the power supply output unit 1026 is configured as an operational amplifier (buffer), a DC/DC converter, a linear regulator, or a constant current source, and is configured to generate a power supply voltage or a power supply current (output signal OUT) to be supplied to the DUT 1.

A decoupling capacitor C1 is arranged in the vicinity of the power supply terminal of the DUT 1. Furthermore, the output terminal of the power supply apparatus 1100 and the power supply terminal of the DUT 1 are connected via a cable. With such an arrangement, the target to be controlled by the power supply apparatus 1100 is not the output signal OUT of the power supply output unit 1026, but in actuality is the power supply voltage $V_{DD}$ applied to the power supply terminal of the DUT 1. With conventional techniques, the controller 1024 outputs a control value such that the difference between the observed value (control target) that is fed back and a predetermined reference value (standard value) becomes zero. Examples of the observed values include a feedback signal that corresponds to the power supply voltage or the power supply current supplied to the DUT 1. For example, a circuit element 1022 indicated by the subtractor symbol in FIG. 1 is configured as an error amplifier (operational amplifier), and is configured to amplify the difference between the measurement value and the reference value. The analog controller 1024 generates a control value such that the difference becomes zero. The state of the power supply output unit 1026 is feedback controlled according to the control value thus generated. As a result, the power supply voltage $V_{DD}$ to be controlled is stabilized to the target value. The parameters that are to be considered when the control target 1010 is controlled are represented by a parasitic parameter 1030, which is a symbolic parameter. The parasitic parameter 1030 includes a parasitic resistance, a parasitic capacitance, a parasitic inductance, and so forth, of the power supply cable and each of the internal components of the power supply apparatus 1100.

RELATED ART DOCUMENTS

Patent Documents

[Patent Document 1]
Japanese Patent Application Laid-Open No. H06-249889

[Patent Document 2]
Japanese Patent Application Laid Open No. 2012-2666

With conventional techniques, the controller 1024 is configured employing an analog circuit. Accordingly, the overall performance of the controller 1024 is fixedly determined by the performance of the analog elements that form the analog circuit, which is a problem. That is to say, with a power supply apparatus 1100 designed assuming that the control target 1010 and the parasitic parameter 1030 are both fixed, if either the control target 1010 or the parasitic parameter 1030 differ from what is assumed in the design, such a power supply apparatus 1100 cannot exhibit its design performance.

Furthermore, with conventional techniques, the control target 1010 and the parasitic parameter 1030 are approximated using a well-fitting equivalent circuit. However, such an approximation cannot be expected to provide high precision. In order to solve such a problem, with conventional techniques, in order to provide stabilized circuit operation, there is a need to design the controller 1024 such that it has a narrow feedback bandwidth, which has the undesirable effect of degrading the circuit properties.

SUMMARY OF THE INVENTION

The present invention has been made in order to solve such a problem. Accordingly, it is an exemplary purpose of an embodiment of the present invention to provide a power supply apparatus which is capable of stabilizing its power supply signal with high speed even if there is fluctuation in the characteristics of the system, including a load.

An embodiment of the present invention relates to a power supply apparatus configured to supply a power supply signal to a power supply terminal of a device via a power supply line. The power supply apparatus comprises: an A/D converter configured to receive, via a feedback line, an analog measurement value that corresponds to the power supply signal supplied to the power supply terminal of the device, and to analog/digital convert the analog measurement value so as to generate a digital measurement value; a digital calculation unit configured to generate, by means of digital calculation, a control value adjusted such that the digital measurement value received from the A/D converter matches a predetermined reference value; a D/A converter configured to digital/analog convert the control value, and to supply an analog power supply signal thus obtained to the power supply terminal of the device via the power supply line; and a feedback ratio calculation unit configured to calculate the ratio between the control value and the digital measurement value. The digital calculation unit is configured to be capable of changing the calculation content based on the ratio calculated by the feedback ratio calculation unit.

A relation $D_{OUT} \geq D_M$ holds true between the control value $D_{OUT}$ and the digital measurement value $D_M$. The feedback ratio, which represents the ratio between the control value $D_{OUT}$ and the digital measurement value $D_M$, i.e., $\beta = D_M / D_{OUT}$, changes in a range between 1 and 0. Such an embodiment allows a responsivity control unit to control the digital calculation unit 30 such that the responsivity of the system is raised according to a reduction in the feedback ratio $\beta$. Thus, such an arrangement is capable of stabilizing the power supply signal to its target value in a short period of time, and/or of suppressing fluctuation in the power supply signal.

Also, the digital calculation unit may comprise: a subtractor configured to generate an error signal which represents the difference between the digital measurement value and the reference value; a scaling unit configured to multiply the error signal by a coefficient that corresponds to the ratio calculated by the feedback ratio calculation unit; and a controller configured to generate the control value based on the error signal output from the scaling unit.

By scaling the error signal, such an arrangement is capable of changing the response speed of the system.

Also, the digital calculation unit may further comprise a selector configured to select one from among the error signal output from the subtractor and the error signal output from the scaling unit, and to output the error signal thus selected to the controller.

Thus, such an arrangement is capable of switching its mode between a mode in which the response speed of the system is changed based on the ratio between the control value $D_{OUT}$ and the digital measurement value $D_M$, and a mode in which the response speed of the system is not changed.

Also, the feedback ratio calculation unit may be configured to calculate a feedback ratio β represented by $\beta = D_M/D_{OUT}$, as the ratio between the control value $D_{OUT}$ and the digital measurement value $D_M$. Also, the scaling unit may be configured to determine the coefficient such that it is substantially inversely proportional to the feedback ratio β.

Also, the feedback ratio calculation unit may be configured to calculate the reciprocal of a feedback ratio represented by $1/\beta = D_{OUT}/D_M$, as the ratio between the control value $D_{OUT}$ and the digital measurement value $D_M$. Also, the scaling unit may be configured to determine the coefficient such that it is substantially proportional to the reciprocal of the feedback ratio $1/\beta$.

Also, the digital calculation unit may comprise: a subtractor configured to generate an error signal which represents the difference between the digital measurement value and the reference value; a controller configured to generate the control value based on the error signal by means of any one operation selected from among a proportional control operation, a proportional-integral control operation, and a proportional-integral-differential control operation; and a coefficient control unit configured to adjust, based on the ratio calculated by the feedback ratio calculation unit, at least one from among a proportional coefficient, an integral coefficient, and a differential coefficient.

By changing such a coefficient of the controller, such an arrangement is capable of changing the response speed of the system.

Also, the digital calculation unit may be configured to be capable of switching its mode between a first mode in which its calculation content is fixed, and a second mode in which its calculation content is controlled according to the ratio calculated by the feedback ratio calculation unit.

For example, in a case in which such a power supply apparatus is employed in a semiconductor test apparatus, such an arrangement is capable of estimating fluctuation in the system in advance. In this case, by switching the mode to the second mode before the system fluctuates, such an arrangement is capable of stabilizing the power supply signal.

Also, the digital calculation unit may be configured to select the second mode before the occurrence of at least one event from among: (1) startup of a power supply signal $S_{PS}$ (power supply on); (2) switching of a resistance value of a detection resistor Rs; (3) change in a load impedance; (4) change of a target value of a power supply voltage $V_{DD}$; and (5) change of a target value of a power supply current $I_{DD}$.

Also, the analog measurement value may be configured to represent a voltage supplied to the power supply terminal.

Also, the analog measurement value may be configured to represent a current supplied to the power supply terminal via the power supply line. Also, the power supply apparatus may further comprise: a detection resistor arranged on the power supply line; and a sense amplifier configured to generate an analog measurement value that corresponds to a voltage across the detection resistor.

Also, the analog measurement value may be configured to represent a value selected from among a voltage supplied to the power supply terminal and a current supplied to the power supply terminal via the power supply line.

Another embodiment of the present invention relates to a test apparatus. The test apparatus comprises the aforementioned power supply apparatus configured to supply electric power to a device under test.

Such an embodiment is capable of judging the quality of the device under test and of detecting defective portions while suppressing the effects of the power supply.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not substantially affect the electric connection therebetween, or that does not damage the functions or effects of the connection therebetween, in addition to a state in which the member A is physically and directly connected to the member B.

Similarly, the state represented by the phrase "the member C is provided between the member A and the member B" includes a state in which the member A is indirectly connected to the member C, or the member B is indirectly connected to the member C via another member that does not substantially affect the electric connection therebetween, or that does not damage the functions or effects of the connection therebetween, in addition to a state in which the member A is directly connected to the member C, or the member B is directly connected to the member C.

Figure 2:
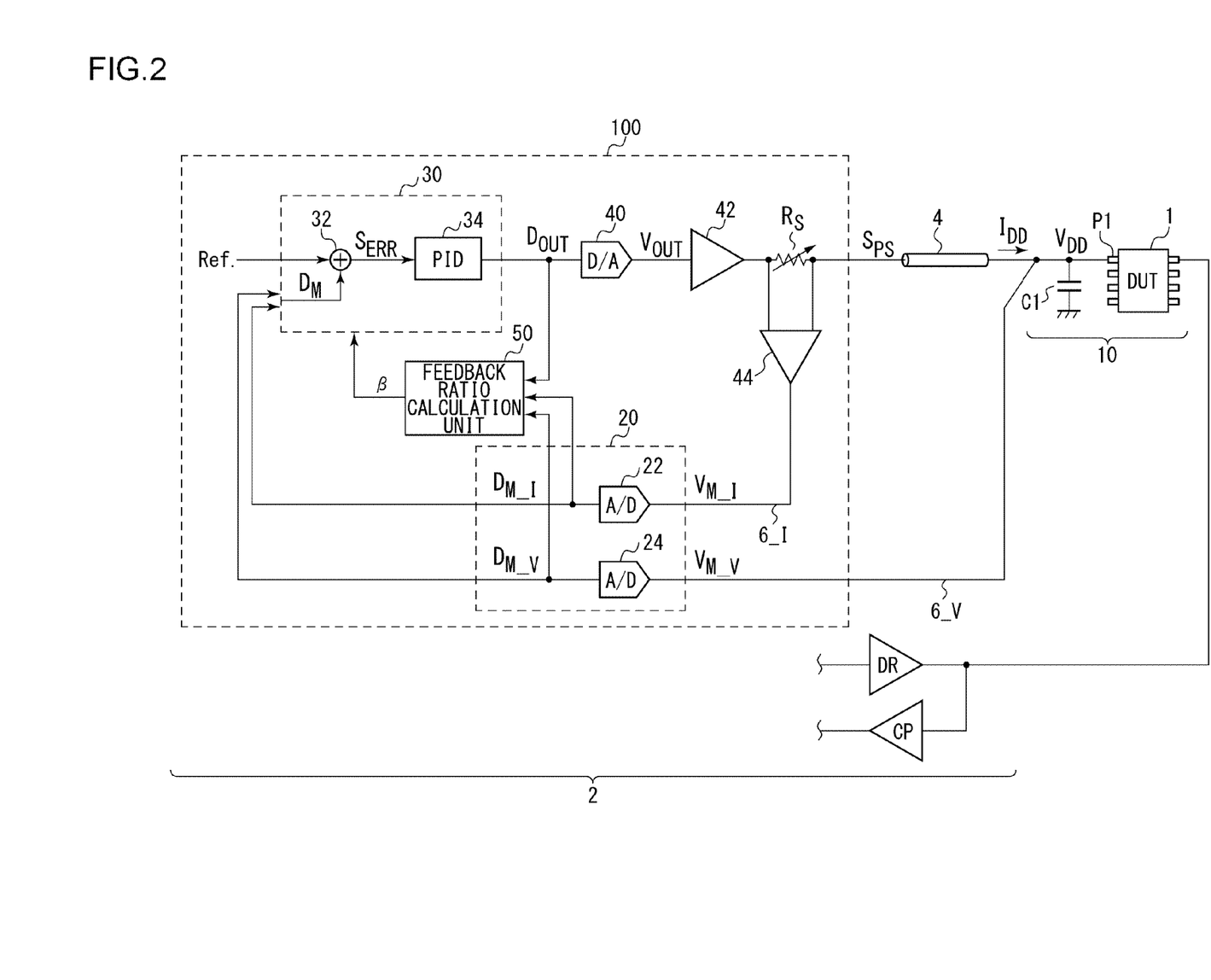
FIG. 2 is a block diagram showing a test apparatus including a power supply apparatus according to an embodiment.

FIG. 2 is a block diagram which shows a test apparatus 2 including a power supply apparatus 100 according to an embodiment. The test apparatus 2 is configured to supply a signal to a DUT 1, and to compare a signal received from the DUT 1 with an expected value so as to judge the quality of the DUT 1 or to identify defective parts of the DUT 1.

The test apparatus 2 includes a driver DR, a comparator (timing comparator) CP, a power supply apparatus 100, and so forth. The driver DR is configured to output a test pattern signal to the DUT 1. The test pattern signal is generated by a timing generator TG, a pattern generator PG, a waveform shaper FC (Format Controller), and so forth (none of which is shown in the drawing), and is input to the driver DR. The signal output from the DUT 1 is input to the comparator CP. The comparator CP compares the signal received from the DUT 1 with a threshold value, and latches the comparison result at an appropriate timing. The output of the comparator CP is compared with its expected value. The above is the schematic configuration of the test apparatus 2.

The power supply apparatus 100 is configured to generate a power supply signal $S_{PS}$ to be supplied to the DUT 1, and to supply the power supply signal $S_{PS}$ thus generated to a power supply terminal P1 of the DUT 1 via a power supply cable (power supply line) 4 or the like.

The power supply apparatus 100 according to the present embodiment is configured to be switched between a voltage supply (VS) mode in which the voltage value $V_{DD}$ of the power supply signal $S_{PS}$ supplied to the DUT 1 is maintained at a constant value, and a current supply (IS) mode in which the current value $I_{DD}$ of the power supply signal is maintained at a constant value.

A typical power supply apparatus has a problem in that, if the load changes suddenly, the feedback control operation for the power supply signal does not follow the sudden change in the load, leading to the output signal deviating from the target value. With the test apparatus 2, the fluctuation in the output signal of the power supply apparatus has an effect on the signal output from the DUT 1. That is to say, this leads to a problem in that the abnormal state (Fail) judged by the comparator CP cannot be judged with respect to whether it is due to the DUT 1 itself or due to the power supply apparatus.

In particular, the degree of fluctuation in the load of the DUT 1 in the test operation is greater than that in a state in which the DUT 1 is mounted on a set (electronic device) after shipment. In such circumstances, the power supply apparatus 100 mounted on the test apparatus 2 is strictly required to be highly responsive to the fluctuation in the load. Description will be made below regarding a configuration of the power supply apparatus 100 which can be suitably employed in the test apparatus 2.

The power supply apparatus 100 includes an A/D converter 20, a digital calculation unit 30, a D/A converter 40, a buffer amplifier 42, a detection resistor Rs, a sense amplifier 44, and a feedback ratio calculation unit 50.

The A/D converter 20 is configured to receive, via a feedback line 6, an analog measurement value $V_M$ that corresponds to the power supply signal $S_{PS}$ supplied to the power supply terminal P1 of the DUT 1, and to analog/digital convert the analog measurement value $V_M$, so as to generate a digital measurement value $D_M$.

More specifically, in the voltage supply mode, the A/D converter 20 analog/digital converts the analog measurement value $V_{M\_V}$ which represents the power supply voltage $V_{DD}$ supplied to the DUT 1, so as to generate a digital measurement value $D_{M\_V}$. As the analog measurement value $V_{M\_V}$, the power supply voltage $V_{DD}$ supplied to the DUT 1 may itself be employed. Also, a stepped-down voltage obtained by dividing the power supply voltage $V_{DD}$ may be employed as the analog measurement value $V_{M\_V}$.

In the current supply mode, the A/D converter 20 is configured to analog/digital convert the analog measurement value $V_{M\_I}$ which represents the power supply current $I_{DD}$ supplied to the DUT 1, so as to generate a digital measurement value $D_{M\_I}$. For example, a detection resistor Rs is arranged on a path of the power supply line 4. At the detection resistor Rs, a voltage drop occurs in proportion to the power supply current $I_{DD}$. The sense amplifier 44 is configured to amplify the voltage drop that occurs at the detection resistor Rs, so as to generate an analog measurement value $V_{M\_I}$. The detection resistor Rs is configured as a variable resistor which is capable of switching its resistance value according to the current range of the power supply current $I_{DD}$.

The A/D converter 20 includes a current A/D converter 22 and a voltage A/D converter 24, which allow the analog measurement value $V_{M\_V}$ and the analog measurement value $V_{M\_I}$ to be converted into the respective digital measurement values. It should be noted that a single A/D converter may be shared between the current supply mode and the voltage supply mode in a time sharing manner.

The digital calculation unit 30 is configured to generate a digital control value $D_{OUT}$ by means of digital calculation. The digital control value $D_{OUT}$ is adjusted such that the digital measurement value $D_M$ received from the A/D converter 20 matches a predetermined reference value Ref. For example, the digital calculation unit 30 may be configured as a CPU (Central Processing Unit), DSP (Digital Signal Processor), FPGA (Field Programmable Gate Array), or the like.

The digital calculation unit 30 is configured to be capable of changing the calculation content, i.e., the control characteristics. In the present specification, the control operation for the calculation content will also be referred to as the "response speed control operation". For example, the digital calculation unit 30 may be configured to perform a PID (proportional-integral-differential) control operation based on the difference (error) between the digital measurement value $D_M$ and the reference value Ref. As an example of changing the calculation content, such an arrangement may change various kinds of parameters (e.g., gain, filter order, cutoff frequency) employed in the PID control operation. Also, the calculation expression may be changed. Also, the digital calculation unit 30 may perform any one of a P control operation, a PI control operation, or a PD control operation, instead of the PID control operation.

More specifically, the digital calculation unit 30 includes a subtractor 32 and a controller 34.

The subtractor 32 is configured to generate an error signal $S_{ERR}$ which represents the difference between the digital measurement value $D_M$ and the reference value Ref. The controller 34 is configured to generate the control value $D_{OUT}$ based on the error signal $S_{ERR}$ by means of any one of (1) a proportional (P) control operation, (2) a proportional-integral (PI) control operation, or (3) a proportional-integral-differential (PID) control operation.

The D/A converter 40 is configured to digital/analog convert the control value $D_{OUT}$, so as to generate an analog voltage $V_{OUT}$. Furthermore, the D/A converter 40 is configured to use the analog voltage $V_{OUT}$ thus obtained as the power supply signal $S_{PS}$, and to supply the power supply signal $S_{PS}$ to the power supply terminal P1 of the device under test 1 via the power supply line 4. On the downstream side of the D/A converter 40, a buffer amplifier 42 having a low output impedance is arranged.

The feedback ratio calculation unit 50 is configured to calculate the feedback ratio β which represents the ratio between the control value $D_{OUT}$ and the digital measurement value $D_M$, or otherwise the reciprocal of the feedback ratio β.

The feedback ratio $β_V$ in the voltage supply mode is represented by the following Expression (1a).

$$β_V = D_{M\_V}/D_{OUT} \quad (1a)$$

On the other hand, the feedback ratio $β_I$ in the current supply mode is represented by the following Expression (1b).

$$β_I = D_{M\_I}/D_{OUT} \quad (1b)$$

The digital calculation unit 30 is configured such that its calculation content can be changed based on the feedback ratio $β_V$ or $β_I$ (or the reciprocal of the feedback ratio). Examples of such calculation content include parameters employed in the generation of the control value $D_{OUT}$, a calculation method, and so forth. Specifically, the digital calculation unit 30 changes its calculation content so as to increase the response speed according to a reduction in the feedback ratio β, i.e., so as to reduce the response speed according to an increase in the feedback ratio β. From another viewpoint, the digital calculation unit 30 has frequency characteristics that change according to the feedback ratio β.

Figure 3:
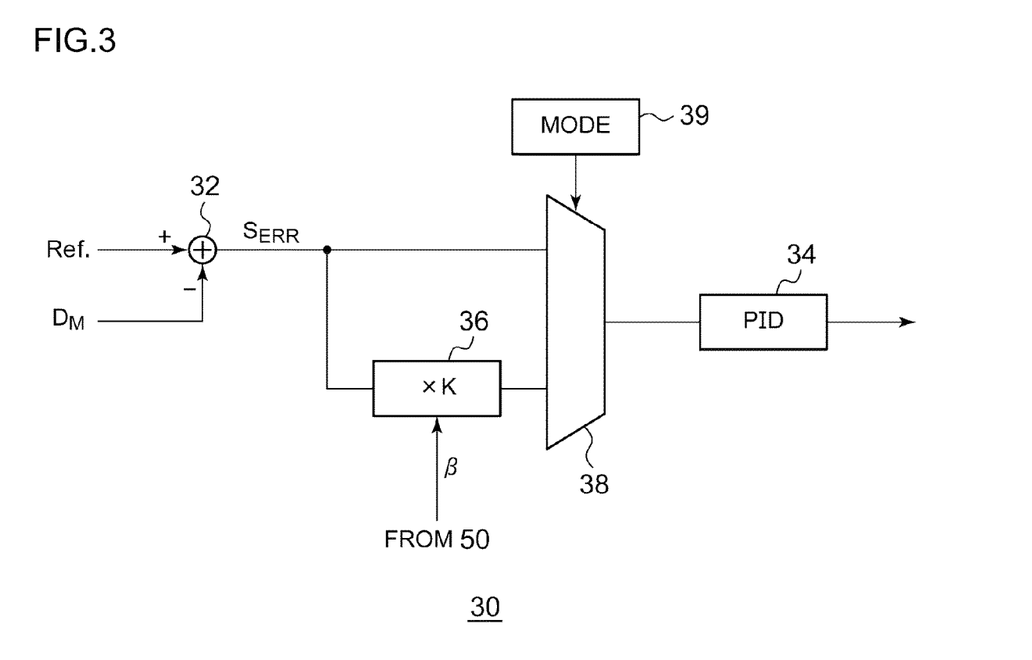
FIG. 3 is a circuit diagram showing an example configuration of a digital calculation unit.

FIG. 3 is a circuit diagram showing an example configuration of the digital calculation unit 30.

The digital calculation unit 30 includes a scaling unit 36, a selector 38, and a mode control unit 39, in addition to the subtractor 32 and the controller 34.

The scaling unit 36 is configured to multiply the error signal $S_{ERR}$ by a coefficient K that corresponds to the feedback ratio β. The coefficient K may be defined in the form of a function f(β) with the feedback ratio β as an argument.

As a simplest example, the coefficient K may be set such that it is substantially inversely proportional to the feedback ratio β. That is to say, the coefficient K may be determined according to the following Expressions (2a) and (2b) such that it is proportional to the reciprocal of the feedback ratio β. It should be noted that "$a_V$" and "$a_I$" each represent a constant.

$$K_V = a_V/β_V \quad (2a)$$

$$K_I = a_I/β_I \quad (2b)$$

Figure 4A:
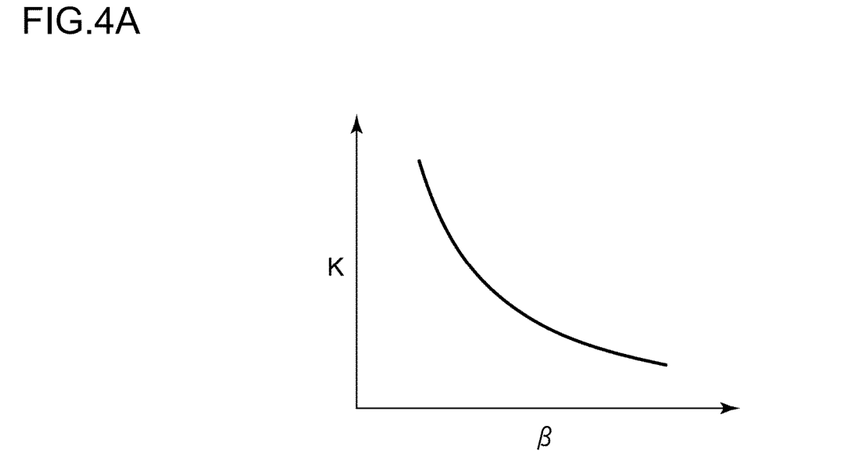
FIGS. 4A and 4B are diagrams each showing a specific example of the relation between the feedback ratio β and the coefficient K.
Figure 4B:
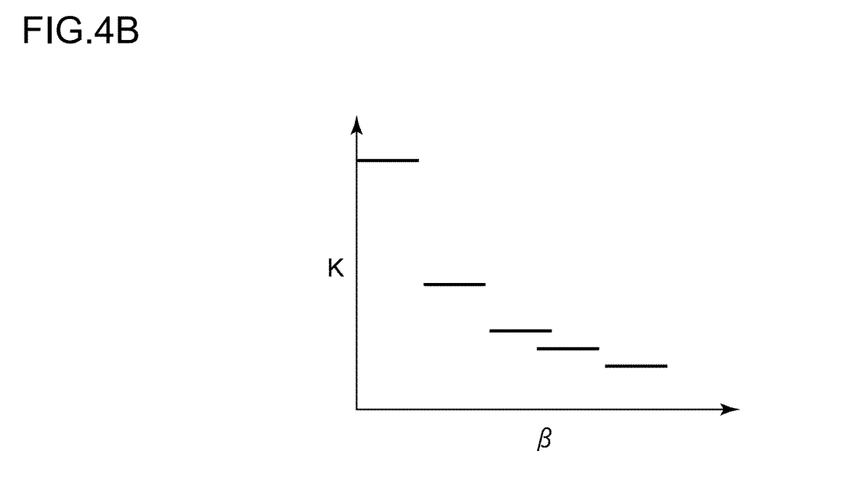

FIGS. 4A and 4B are diagrams each showing a specific example of the relation between the feedback ratio β and the coefficient K. FIG. 4A shows an arrangement in which the coefficient K is inversely proportional to the feedback ratio β. In this case, such an arrangement requires a division calculation. Thus, in order to calculate the coefficient K, such an arrangement requires a divider. FIG. 4B shows an arrangement configured to select a discrete coefficient K according to the range of the feedback ratio β. With such an arrangement, the coefficient K may be set using a reference table. Alternatively, the coefficient K may be calculated by bit shifting. Thus, such an arrangement does not require a divider.

With a modification, the feedback ratio calculation unit 50 may calculate the reciprocal of the feedback ratio, i.e., 1/β, according to the following Expressions (3a) and (3b).

$$1/β_V = D_{OUT}/D_{M\_V} \quad (3a)$$

$$1/β_I = D_{OUT}/D_{M\_I} \quad (3b)$$

In this case, the scaling unit 36 may calculate the coefficient K based on the reciprocal of the feedback ratio 1/β calculated by the feedback ratio calculation unit 50. More specifically, the scaling unit 36 may calculate the coefficient K by multiplying the reciprocal 1/β by the coefficient a. With such an arrangement, in order to calculate the coefficient K, the aforementioned divider can be replaced by the multiplier, thereby saving hardware resources.

It should be noted that such an arrangement does not necessarily require the coefficient K to be inversely proportional to the feedback ratio β. Rather, the coefficient K may preferably be set based on simulation results or actual measurement results so as to reduce fluctuation in the power supply signal $S_{PS}$ which is a control value of the system.

The selector 38 is configured to receive the error signal $S_{ERR}$ from the subtractor 32, and to receive the error signal $S_{ERR}$ from the scaling unit 36. In the first mode, the selector 38 is configured to select the former error signal $S_{ERR}$. In the second mode, the selector 38 is configured to select the latter error signal $S_{ERR}$. The mode control unit 39 is configured to control the mode between the first mode and the second mode. For example, in a normal state in which the overall system including the DUT 1 and the power supply apparatus 100 is in the stable state, the mode control unit 39 selects the first mode. Before the occurrence of an event that requires raising the response speed of the power supply apparatus 100, the mode control unit 39 selects the second mode. When the system becomes stable after the second mode is selected, the mode control unit 39 selects the first mode.

Examples of events that require raising the response speed will be listed below.

(1) Startup of the power supply signal $S_{PS}$ (power supply on)

(2) Switching of the resistance value of the detection resistor Rs.

(3) Fluctuation in load impedance.

(4) Change in the target value of the power supply voltage $V_{DD}$.

(5) Change in the target value of the power supply current $I_{DD}$.

The above is the configuration of the power supply apparatus 100. Next, description will be made regarding the operation thereof.

Figure 5:
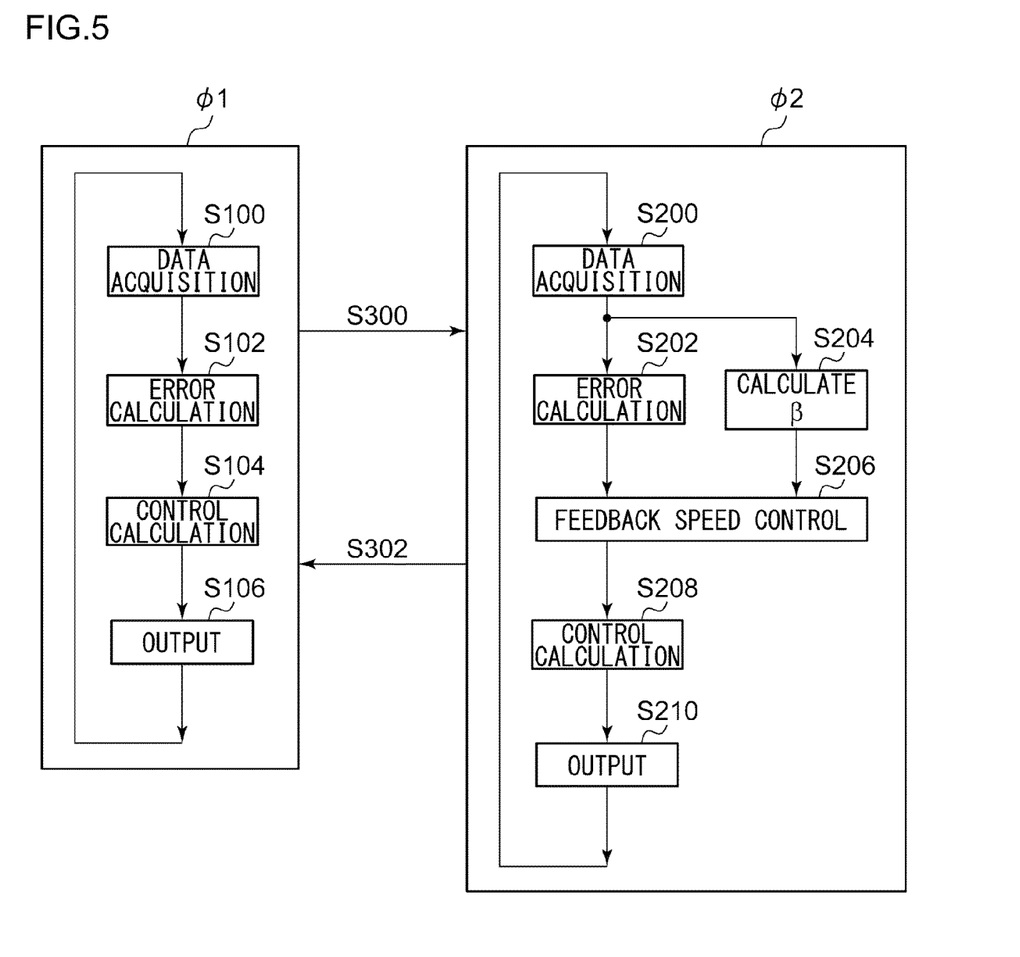
FIG. 5 is a flowchart showing an operation sequence of the power supply apparatus shown in FIG. 2.

FIG. 5 is a flowchart showing an operation sequence of the power supply apparatus 100 shown in FIG. 2. In the first mode φ1, the operation described below is repeatedly performed.

Acquisition of the digital measurement value $D_M$ by means of the A/D converter 20 (S100).

Generation of the error signal $S_{ERR}$ by means of the digital calculation unit 30 (S102).

Generation of the control value $D_{OUT}$ by means of the controller 34 (S104).

Generation of the analog voltage $V_{OUT}$ by means of the D/A converter 40 (S106).

In the second mode φ2, the operation described below is repeatedly performed.

Acquisition of the digital measurement value $D_M$ by means of the A/D converter 20 (S200).

Generation of the error signal $S_{ERR}$ by means of the digital calculation unit 30 (S202).

Calculation of the feedback ratio β by means of the feedback ratio calculation unit 50 (S204).

Control of the response speed by means of the digital calculation unit 30 (S206).

Generation of the control value $D_{OUT}$ by means of the controller 34 (S208).

Generation of the analog voltage $V_{OUT}$ by means of the D/A converter 40 (S210).

The mode control unit 39 is configured to switch the mode between the first mode φ1 and the second mode φ2 according to the state of the system. Specifically, when any one of the aforementioned events is to occur, in advance of this, the mode control unit 39 switches the mode to the second mode φ2 (S300). After the system becomes stable, the mode control unit 39 returns the mode to the first mode φ1 (S302).

Figure 6A:
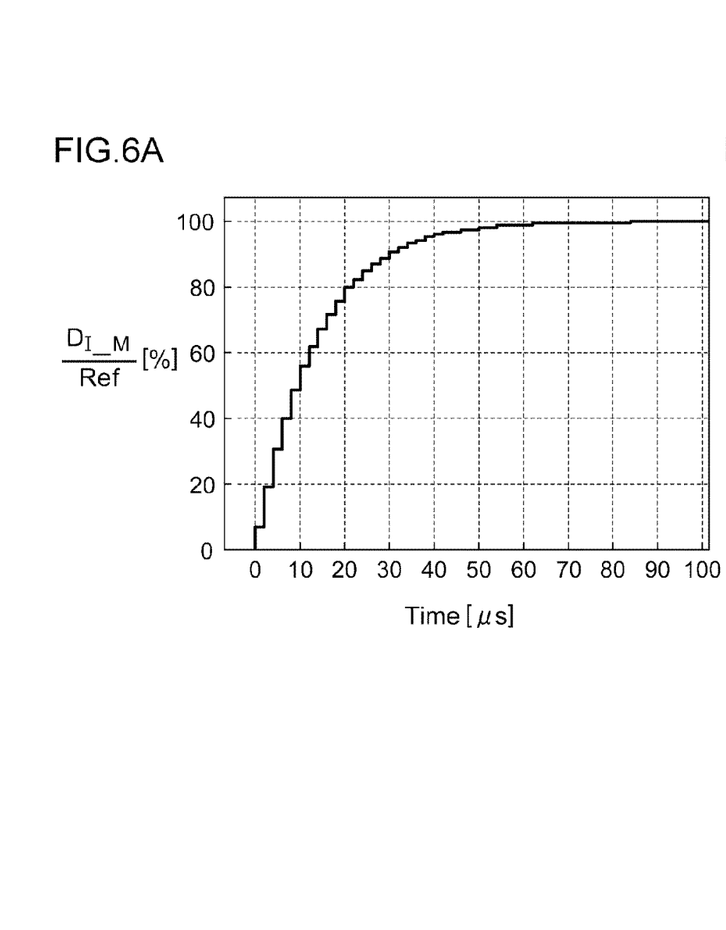
FIGS. 6A and 6B are waveform diagrams each showing the current $I_{DD}$ ($D_{M\_I}$) in the startup operation of the current supply mode of the power supply apparatus shown in FIG. 2.
Figure 6B:
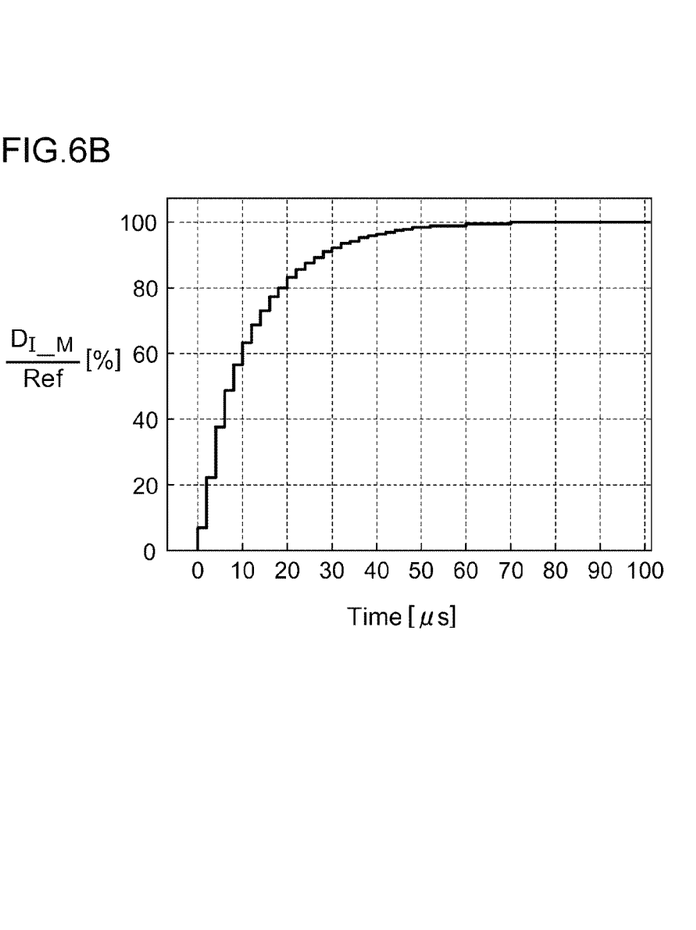

FIGS. 6A and 6B are diagrams each showing a current $I_{DD}$ ($D_{M\_I}$) supplied by the power supply apparatus 100 shown in FIG. 2 in the startup operation of its current supply mode. The vertical axis represents the ratio of the current value with respect to the reference value Ref. FIG. 6A shows an operation for when the power supply apparatus 100 selects the first mode φ1 in which the digital calculation unit 30 does not perform the response speed control operation. FIG. 6B shows an operation for when the power supply apparatus 100 selects the second mode φ2 in which the digital calculation unit 30 performs the response speed control operation. Here, the DUT 1 has an impedance of 0Ω.

As shown in FIG. 6A, in a case in which the digital calculation unit 30 does not perform the response speed control operation, such an arrangement requires a settling time of 66 μs for the digital measurement value $D_{M\_I}$ to reach 99% of the reference value Ref. In contrast, in a case in which the digital calculation unit 30 performs the response speed control operation based on the feedback ratio β, such an arrangement allows the settling time to be reduced to 60 μs as shown in FIG. 6B.

Figure 7A:
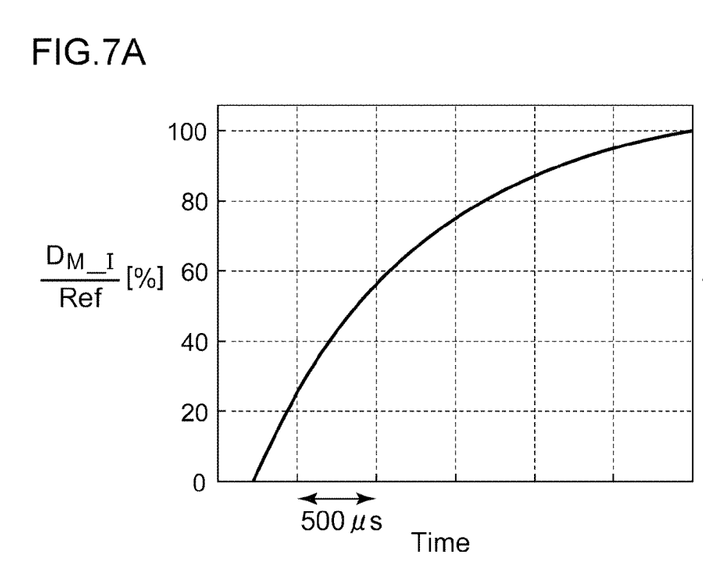
FIGS. 7A and 7B are waveform diagrams each showing the current $I_{DD}$ ($D_{M\_I}$) in the startup operation of the current supply mode of the power supply apparatus shown in FIG. 2.
Figure 7B:
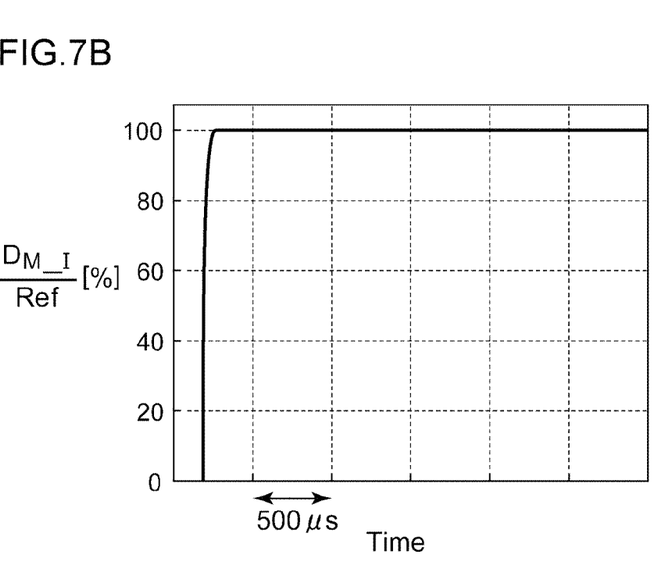

As the load impedance becomes greater, the effect becomes marked. FIGS. 7A and 7B are waveform diagrams each showing the current $I_{DD}$ ($D_{M\_I}$) supplied by the power supply apparatus 100 shown in FIG. 2 in the startup operation of the current supply mode. Here, the DUT 1 has an impedance of 64 kΩ.

As shown in FIG. 7A, in a case in which the digital calculation unit 30 does not perform the response speed control operation, such an arrangement requires a settling time of 4.7 ms for the digital measurement value $D_{M\_I}$ to reach 99% of the reference value Ref. In contrast, in a case in which the digital calculation unit 30 performs the response speed control operation based on the feedback ratio β, such an arrangement allows the settling time to be reduced to 60 μs as shown in FIG. 7B.

As described above, with the power supply apparatus 100 according to the embodiment, by calculating the feedback ratio β or otherwise the reciprocal of the feedback ratio β so as to estimate the state of the load, and by controlling the response speed of the digital calculation unit 30 based on the estimation result, such an arrangement is capable of stabilizing the power supply signal $S_{PS}$ to be the reference value in a short period of time.

In a case in which the digital calculation unit 30 does not perform the response speed control operation as shown in FIGS. 6A and 7A, the settling time changes according to a change in the impedance of the DUT 1. In contrast, in a case in which the digital calculation unit 30 performs the response speed control operation, such an arrangement is capable of maintaining the settling time independently of the state of the system such as the impedance value of the DUT 1.

Description has been made with reference to FIGS. 6A, 6B, 7A, and 7B regarding an arrangement operating in the current supply mode. Also, the present invention can be applied to an arrangement configured to operate in the voltage supply mode, which provides the same advantages as described above.

Description has been made regarding the present invention with reference to the embodiments. The above-described embodiments have been described for exemplary purposes only, and are by no means intended to be interpreted restrictively. Rather, various modifications may be made by making various combinations of the aforementioned components or processes. Description will be made below regarding such modifications.

[Modification 1]

Figure 8:
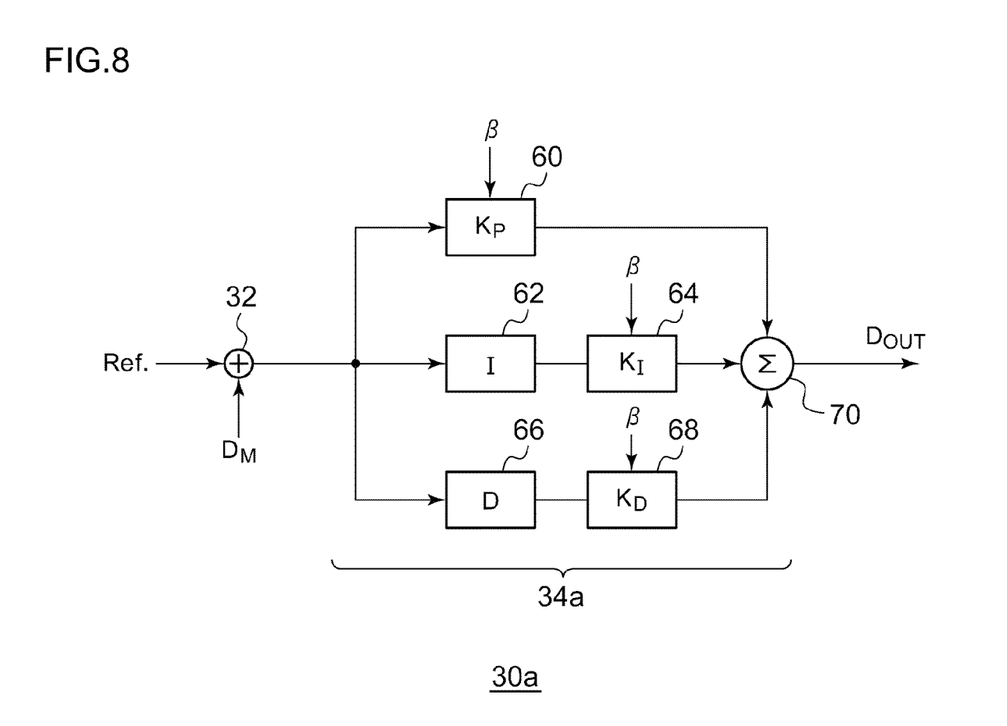
FIG. 8 is a diagram showing a configuration of a digital calculation unit according to a first modification.

FIG. 8 is a diagram showing a configuration of a digital calculation unit 30a according to a first modification.

A controller 34a included in the digital calculation unit 30a is configured as a PID controller. A multiplier 60 is configured to multiply the error signal $S_{ERR}$ by a constant coefficient $K_P$. An integrator 62 is configured to integrate the error signal $S_{ERR}$. A multiplier 64 is configured to multiply the output of the integrator 62 by an integration coefficient $K_I$. A differentiator 66 is configured to differentiate the error signal $S_{ERR}$. A multiplier 68 is configured to multiply the output of the differentiator 66 by a differential coefficient $K_D$. An adder 70 is configured to sum the outputs of the multipliers 60, 64, and 68, so as to generate the control value $D_{OUT}$.

Based on the feedback ratio β (or otherwise the reciprocal of the feedback ratio β), such an arrangement is configured to allow the multipliers 60, 64, and 68 included in the controller 34a to adjust at least one of the proportional coefficient $K_P$, the integral coefficient $K_I$, or the differential coefficient $K_D$. Such a coefficient may be obtained by calculation. Also, such a coefficient may be obtained using a reference table prepared beforehand.

Such a modification also provides the same advantages as those described in the aforementioned embodiment. Such a modification allows the coefficients $K_P$, $K_I$, and $K_D$ to have different dependence on the feedback ratio β. Thus, such a modification provides an optimum control operation as compared with the digital calculation unit 30 according to the aforementioned embodiment.

[Modification 2]

With the digital calculation unit 30a shown in FIG. 8 configured to control the content of the calculation according to the feedback ratio β, the digital calculation unit 30a may be configured to switch the control method between the PID control method, P control method, PI control method, PD control method, and so forth.

[Modification 3]

Description has been made in the embodiment regarding the power supply apparatus 100 configured to be capable of switching the mode between the voltage supply mode and the current supply mode. Also, the present invention is applicable to a power supply apparatus configured to operate in the voltage supply mode alone or otherwise in the current supply mode alone.

[Modification 4]

Description has been made in the embodiment regarding an arrangement in which the mode can be switched between the first mode and the second mode, and when a predetermined event involving a change in the system occurs, the mode is selectively switched to the second mode. Also, an arrangement may be made configured to operate in the second mode alone at all times.

While the preferred embodiments of the present invention have been described using specific terms, such description is for illustrative purposes only, and it is to be understood that changes and variations may be made without departing from the spirit or scope of the appended claims.

What is claimed is:

1. A power supply apparatus structured to supply a power supply signal to a power supply terminal of a device via a power supply line, the power supply apparatus comprising:
   an A/D converter structured to receive, via a feedback line, an analog measurement value that corresponds to the power supply signal supplied to the power supply terminal of the device, and to analog/digital convert the analog measurement value so as to generate a digital measurement value;
   a digital calculation unit structured to generate, by means of digital calculation, a control value adjusted such that the digital measurement value received from the A/D converter matches a predetermined reference value;
   a D/A converter structured to digital/analog convert the control value to an analog power supply signal, and to supply the analog power supply signal to the power supply terminal of the device via the power supply line, wherein the analog power supply signal is proportional to the control value; and
   a feedback ratio calculation unit structured to calculate the ratio between the control value and the digital measurement value,
   wherein the digital calculation unit is structured to change its calculation content based on the ratio calculated by the feedback ratio calculation unit; and
   the analog power signal is proportional to the control value for both a stable state and a transient state.

2. The power supply apparatus according to claim 1, wherein the digital calculation unit comprises:
   a subtractor structured to generate an error signal which represents the difference between the digital measurement value and the reference value;
   a scaling unit structured to multiply the error signal by a coefficient that corresponds to the ratio calculated by the feedback ratio calculation unit; and
   a controller structured to generate the control value based on the error signal output from the scaling unit.

3. The power supply apparatus according to claim 2, wherein the digital calculation unit further comprises a selector structured to select one from among the error signal output from the subtractor and the error signal output from the scaling unit, and to output the error signal thus selected to the controller.

4. The power supply apparatus according to claim 2, wherein the feedback ratio calculation unit is structured to calculate a feedback ratio $\beta$ represented by $\beta=D_M/D_{OUT}$, as the ratio between the control value $D_{OUT}$ and the digital measurement value $D_M$,
   and wherein the scaling unit is structured to determine the coefficient such that it is substantially inversely proportional to the feedback ratio $\beta$.

5. The power supply apparatus according to claim 2, wherein the feedback ratio calculation unit is structured to calculate the reciprocal of a feedback ratio represented by $1/\beta=D_{OUT}/D_M$, as the ratio between the control value $D_{OUT}$ and the digital measurement value $D_M$,
   and wherein the scaling unit is structured to determine the coefficient such that it is substantially proportional to the reciprocal of the feedback ratio $1/\beta$.

6. The power supply apparatus according to claim 1, wherein the digital calculation unit comprises:
   a subtractor structured to generate an error signal which represents the difference between the digital measurement value and the reference value;
   a controller structured to generate the control value based on the error signal by means of any one operation selected from among a proportional control operation, a proportional-integral control operation, and a proportional-integral-differential control operation; and
   a coefficient control unit structured to adjust, based on the ratio calculated by the feedback ratio calculation unit, at least one from among a proportional coefficient, an integral coefficient, and a differential coefficient.

7. The power supply apparatus according to claim 1, wherein the digital calculation unit is structured to switch its mode between a first mode in which its calculation content is fixed, and a second mode in which its calculation content is controlled according to the ratio calculated by the feedback ratio calculation unit.

8. The power supply apparatus according to claim 7, wherein the digital calculation unit is structured to select the second mode before the occurrence of at least one event from among:
   (1) startup of a power supply signal $S_{PS}$ (power supply on);
   (2) switching of a resistance value of a detection resistor Rs;
   (3) change in a load impedance;
   (4) change of a target value of a power supply voltage $V_{DD}$; and
   (5) change of a target value of a power supply current $I_{DD}$.

9. The power supply apparatus according to claim 1, wherein the analog measurement value represents a voltage supplied to the power supply terminal.

10. The power supply apparatus according to claim 1, wherein the analog measurement value represents a current supplied to the power supply terminal via the power supply line,
    and wherein the power supply apparatus further comprises:
    a detection resistor arranged on the power supply line; and
    a sense amplifier structured to generate an analog measurement value that corresponds to a voltage across the detection resistor.

11. The power supply apparatus according to claim 1, wherein the analog measurement value represents a value selected from among a voltage supplied to the power supply terminal and a current supplied to the power supply terminal via the power supply line.

12. A test apparatus comprising the power supply apparatus according to claim 1, structured to supply electric power to a device under test.

* * * * *